(12) United States Patent
Delbaere et al.

(10) Patent No.: US 9,733,292 B2
(45) Date of Patent: Aug. 15, 2017

(54) METHOD FOR DIAGNOSING AN OPERATING STATE OF A CONTACTOR AND CONTACTOR FOR IMPLEMENTING SAID METHOD

(71) Applicant: Schneider Electric Industries SAS, Rueil-Malmaison (FR)

(72) Inventors: Stéphane Delbaere, Saint Martin d'Uriage (FR); Rémy Orban, Grenoble (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 1064 days.

(21) Appl. No.: 13/650,598

(22) Filed: Oct. 12, 2012

(65) Prior Publication Data

US 2013/0103334 A1   Apr. 25, 2013

(30) Foreign Application Priority Data

Oct. 21, 2011   (FR) ...................................... 11 03225

(51) Int. Cl.
*G01R 31/02* (2006.01)
*G01R 19/00* (2006.01)
(Continued)

(52) U.S. Cl.
CPC ......... *G01R 31/02* (2013.01); *G01R 19/0046* (2013.01); *G06F 15/00* (2013.01);
(Continued)

(58) Field of Classification Search
CPC .................................................... G01R 31/02
See application file for complete search history.

(56) References Cited

U.S. PATENT DOCUMENTS 6,225,807 B1 * 5/2001 Pohl ..................... H01H 1/0015
324/423
6,313,636 B1   11/2001 Pohl et al.
(Continued)

FOREIGN PATENT DOCUMENTS

CN   101118816 A   2/2008
CN   201689159   12/2010
(Continued)

*Primary Examiner* — Manuel Rivera Vargas
(74) *Attorney, Agent, or Firm* — Steptoe & Johnson LLP

(57) ABSTRACT

A method for diagnosing an operating state, i.e., wear, of a contactor which includes a processing unit directing voltage control means; an, actuating coil; means for measuring an electric characteristic of the actuating coil; and a diode in parallel with the coil and the measuring means; the method including creating, for a specific contactor design, a plurality of variation curves of an electric characteristic of the coils of such contactors, over a drop-out period, by testing said contactors by sending a drop-out order fixing a drop-out voltage across the coil; after the drop-out order, repeatedly measuring the electric characteristic of the coil during a drop-out period; later sending a diagnostic drop-out order fixing the same drop-out voltage across the terminals of an actuating coil of a subject contactor being diagnosed; then measuring the same electric characteristic of the subject coil during a drop-out period; identifying a measured value of that characteristic of the subject coil, then comparing that measured value with the variation curves of the plurality of contactors of the same design, thereby diagnosing a state of wear of the subject contactor.

27 Claims, 7 Drawing Sheets

(51) Int. Cl.
  *G06F 15/00* (2006.01)
  *H01H 1/00* (2006.01)
  *H01H 47/00* (2006.01)
  *H01H 51/00* (2006.01)
(52) U.S. Cl.
  CPC ........ *H01H 1/0015* (2013.01); *H01H 47/002* (2013.01); *H01H 51/00* (2013.01)

(56) References Cited

U.S. PATENT DOCUMENTS

| | | |
|---|---|---|
| 7,109,720 B2 | 9/2006 | Baurand et al. |
| 7,978,036 B2 | 7/2011 | Adunka et al. |
| 2005/0122117 A1 | 6/2005 | Baurand et al. |
| 2008/0030917 A1 | 2/2008 | Takahashi et al. |
| 2008/0110732 A1 | 5/2008 | Adunka et al. |
| 2009/0144019 A1 | 6/2009 | Elsner et al. |
| 2012/0217944 A1* | 8/2012 | Wada ................ G01R 19/0092 323/282 |

FOREIGN PATENT DOCUMENTS

| | | |
|---|---|---|
| DE | 197 34 224 C1 | 2/1999 |
| DE | 197 34 224 C1 | 9/1999 |
| DE | 10 2010 003 485 A1 | 10/2011 |
| EP | 1 555 683 A1 | 7/2005 |
| EP | 1555683 A1 | 7/2005 |
| FR | 2 834 120 | 6/2003 |
| JP | H10-335140 | 12/1998 |
| JP | 2001-506802 | 5/2001 |
| WO | WO 2005/111641 | 11/2005 |
| WO | WO 2006/069957 A1 | 7/2006 |
| WO | WO 2007/033913 A1 | 3/2007 |

* cited by examiner

US 9,733,292 B2

METHOD FOR DIAGNOSING AN OPERATING STATE OF A CONTACTOR AND CONTACTOR FOR IMPLEMENTING SAID METHOD

BACKGROUND OF THE INVENTION

The invention relates to a method for diagnosing an operating state of a contactor comprising a processing unit designed to act on voltage control means. The contactor further comprises at least one actuating coil, means for measuring at least one electric characteristic of said at least one actuating coil and at least one free-wheel diode connected in parallel to said at least one actuating coil and to the means for measuring.

The invention also relates to a contactor for implementation of said method. Said contactor comprises an electromagnetic actuator having a magnetic circuit formed by a magnetic yoke and a movable ferromagnetic coil, control means, and at least one actuating coil connected to a first and second power supply terminal via said control means. A processing unit is designed to act on the voltage control means. The contactor also comprises means for measuring an electric characteristic of said actuating coil. At least one free wheel diode is connected in parallel to said at least one actuating coil and the means for measuring.

STATE OF THE PRIOR ART

Methods for diagnosing a state of wear of a contactor are called on to be implemented increasingly often in the processing means of the contactors. It is in fact very useful to know the level of wear of a contactor in order to schedule suitable maintenance during the lifetime of said contactor.

Certain existing patents thus describe wear diagnostic methods. Implementation of these methods does however generally result in additional costs that are often prohibitive for industrial use of the products.

The Patent referenced U.S. Pat. No. 6,225,807 describes a method for evaluating the residual lifetime of a contactor. The method consists in determining the wear of the contact pads by determining the decrease of the effect of the pole springs on the opening phase of the contacts. This decrease of the effect of the springs is correlated to the decrease of the elapsed time between two precise moments which are:
the moment at which movement of the movable part begins in the opening phase;
the moment at which opening of the power contacts takes place.

The first moment is determined by means of identification of a coil overvoltage generated on shutoff of the control voltage. The second moment is determined by means of the voltage which appears at the terminals of the contacts when the latter are open.

This method presents the drawback of having to perform acquisition of the voltages at the level of the poles, and of the overvoltage on opening. These acquisitions involve implementation of additional means that can prove to be costly.

Other patents (FR2834120) describe a method for diagnosing end of lifetime based on evaluation of the variation of contact crushings made from measurement of the coil voltage and from the state of an auxiliary contact. This method does not enable an end of lifetime due to mechanical failure, linked to frictions for example, to be diagnosed. This method further presents the drawback of requiring dedicated sensors for acquisition of the power currents.

Finally, known diagnostic methods are incomplete as they generally do not take account of two phenomena independent from contact crushing but able to accelerate end of lifetime of the contactor. These phenomena are on the one hand the frequency and intensity of sticking of the pads, and on the other hand mechanical failures. The frequency and intensity of sticking of the pads are commonly called microwelds. What is meant by mechanical failure is malfunctioning of the contactor linked to friction, wear, deformation of the moving mechanisms, etc.

SUMMARY OF THE INVENTION

The object of the invention is therefore to remedy the shortcomings of the state of the technique so as to propose a method for diagnosing operation, in particular contactor wear, requiring neither current sensors nor voltage sensors at the level of the power contacts.

The method according to the invention consists in:
sending a drop-out order consisting in fixing a voltage called drop-out voltage at the terminals of the actuating coil;
measuring an electric characteristic of said actuating coil during a drop-out time;
reconstituting at least one specific value from the measurements;
comparing said at least one specific value with a specific initial operation reference value of the contactor;
diagnosing the state of wear of the contactor according to the positioning of said at least one specific value with respect to the initial reference value.

According to a mode of development of the invention, the drop-out voltage is fixed by the free wheel diode, the actuating coil being in "free wheel" mode during a part of the drop-out time.

Advantageously, the actuating coil is in "free wheel" mode throughout the whole of the drop-out time.

According to another mode of development of the invention, shunting means command a Zener diode to fix the drop-out voltage at the terminals of the actuating coil, said coil being in "Zener" mode during a part of the drop-out time.

Preferably, the actuating coil is in "Zener" mode during an intermediate drop-out time, the intermediate drop-out time being shorter than the total drop-out time.

According to a first embodiment of the method according to the invention, said electric characteristic of said actuating coil measured during a total drop-out time is the electric current flowing in the actuating coil.

Preferably, the method for diagnosing consists in:
determining at least one specific value on a curve plot of the variation of the electric current corresponding to a time to reach a first local maximum on the variation curve;
diagnosing the operating state of the contactor according to the positioning of the first local maximum with respect to a reference value.

Advantageously, the method consists in determining a maximum current reached at the level of the first local maximum (B) on the current variation curve (Si).

According to a second embodiment of the invention, said electric characteristic of said actuating coil measured during a drop-out time is the electric voltage at the terminals of the actuating coil.

Preferably, the method for diagnosing consists in:
determining at least one specific value on a curve plot of the variation of the electric voltage corresponding to a time to reach a first local maximum on the variation curve,
diagnosing the operating state of the contactor according to the positioning of the first local maximum with respect to a reference value.

The processing unit of the contactor according to the invention comprises means for:
reconstituting at least one specific value from measurement of the electric characteristics (K);
comparing said at least one specific value with a specific initial operation reference value of the contactor;
diagnosing the state of operation of the contactor according to the positioning of said at least one specific value with respect to a reference value.

According to a mode of development, the contactor comprises a Zener diode connected in series with the actuating coil.

According to a particular mode of development, the Zener diode is inserted in series with the actuating coil and the means for measuring the electric current, shunting means being connected in parallel with said diode so as to shunt said Zener diode when the latter are in a closed position.

Advantageously, the magnetic circuit of the actuator comprises a permanent magnet.

BRIEF DESCRIPTION OF THE DRAWINGS

Other advantages and features will become more clearly apparent from the following description of particular embodiments of the invention, given for non-restrictive example purposes only, and represented in the appended drawings in which.

DETAILED DESCRIPTION OF AN EMBODIMENT

Figure 8:
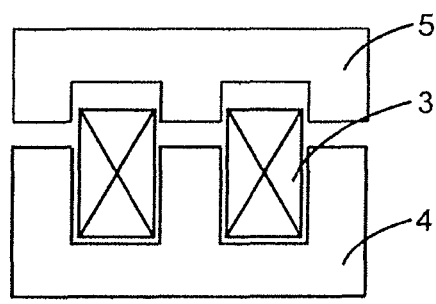
FIG. 8 represents a wiring diagram of a contactor actuator according to an embodiment of the invention.

The method for diagnosing an operating state of a contactor according to the invention is particularly designed for a contactor having an electromagnetic actuator comprising a magnetic circuit formed by a magnetic yoke 4 and a ferromagnetic movable part 5 (FIG. 8). Movement of the movable part is commanded by at least one actuating coil 3 connected to first and second supply terminals B1, B2 via coil voltage control means 20. A processing unit 2 is designed to act on the coil voltage control means 20, such as in particular MOS or IGBT transistors.

The method for diagnosing an operating state of the contactor comprises three successive steps.

The first step consists in commanding the actuating coil 3, following detection of an opening order of the contactor, so as on the one hand to remove the electric energy stored in the latter to reduce the magnetic force and to enable movement of the movable part 5 of the actuator, and on the other hand to generate a signal representative of movement of the movable part 5 of the actuator. Said signal is proportional to an electric characteristic K of the coil. The control means 20 send a drop-out order consisting in fixing a voltage called drop-out voltage at the terminals L1, L2 of the actuating coil 3.

The second step consists in performing acquisition of the specific values on this signal during a drop-out phase. These specific values are correlated to the speed of movement of the movable part 5.

According to a first embodiment of the invention, the electric characteristic K of said actuating coil 3, measured during a total drop-out time Ta, is the electric current I flowing in the actuating coil 3. The second step of the diagnostic method then consists in determining the specific values on the electric current signal I flowing in the actuating coil 3.

According to a second embodiment of the invention, the electric characteristic K of said actuating coil 3, measured during a total drop-out time Ta, is the electric voltage U at the terminals of the actuating coil. The second step of the diagnostic method then consists in determining the specific values on the voltage signal at the terminals of the actuating coil 3, such as for example a voltage value at a set time.

The third step consists in processing of these specific values enabling the state of operation of the contactor to be determined, in particular its level of wear.

Figure 1:
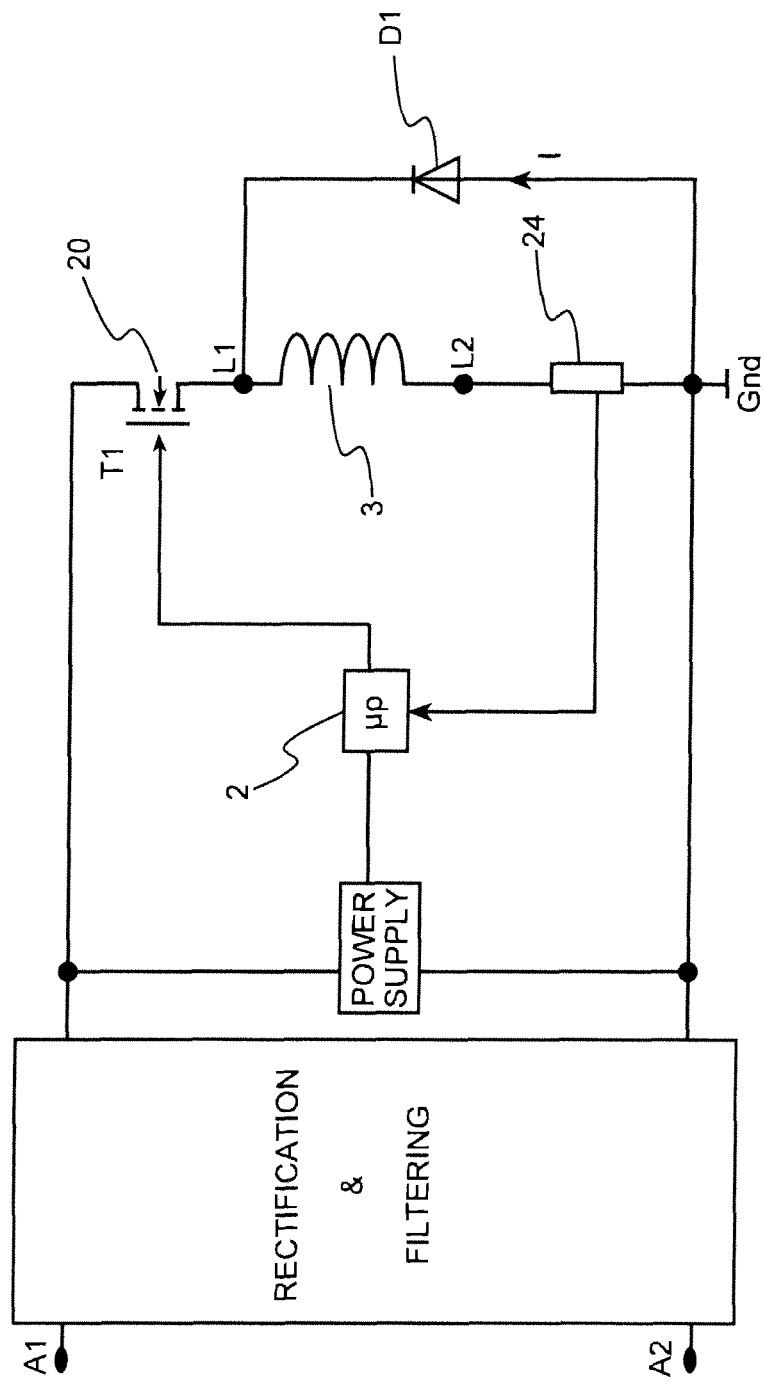
FIGS. 1 to 3 represent functional wiring diagrams of control and regulation circuits suitable for implementation of a diagnostic method according to the different embodiments of the invention.

According to a first embodiment of the invention, the electric characteristic K measured in the course of the method being the electric current flowing in the control coil, the contactor then comprises means for measuring 24 the electric current I flowing in the actuating coil 3 (FIG. 1). Said means can comprise a resistive shunt connected in series with the actuating coil 3. Finally, the free wheel diode D1 is connected in parallel with the assembly formed by said at least one actuating coil 3, and the means for measuring 24 the electric current I.

Figure 4A:
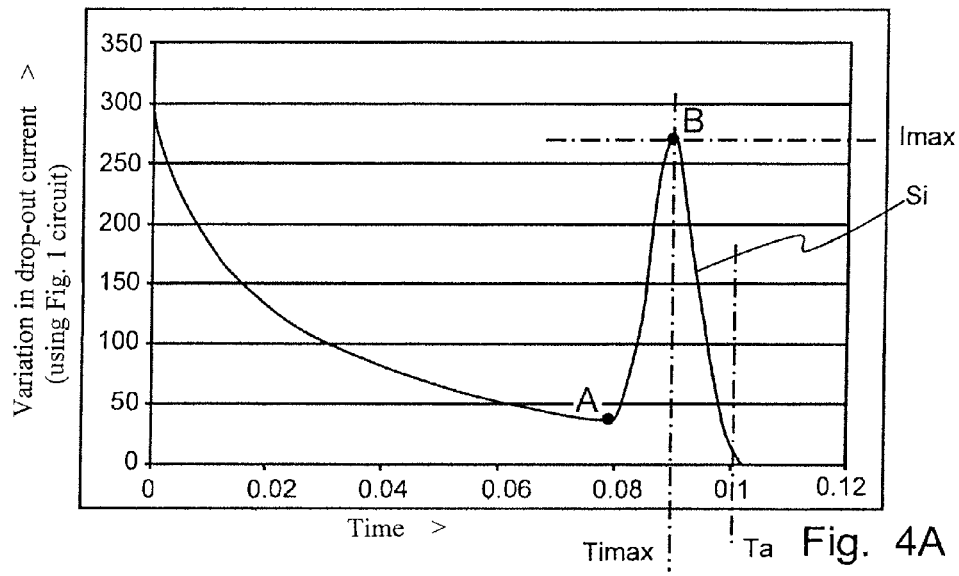
FIG. 4A represents a curve plot of the variation of a drop-out current measured during the method for diagnosing wear according to the first embodiment of the invention using a control circuit according to FIG. 1.

In the first step of the diagnostic method according to this first embodiment, the control means 20 send a drop-out order consisting in fixing a voltage called drop-out voltage at the terminals L1, L2 of the actuating coil 3. As represented in FIG. 4A, the drop-out voltage is fixed by the free wheel diode D1. The coil is then in "free wheel" mode during a drop-out time Ta. The electric current that is generated in the coil is representative of the speed of movement of the movable part 5 of the actuator.

Figure 4B:
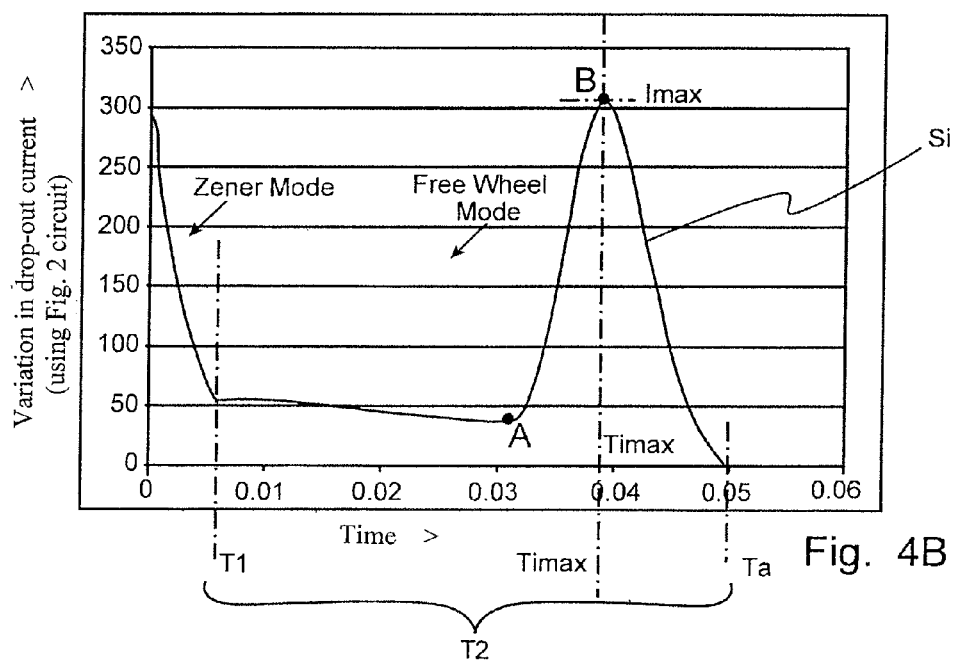
FIG. 4B represents a curve plot of the variation of a drop-out current measured during the method for diagnosing wear according to the first embodiment of the invention using a control circuit according to FIG. 2.

According to an alternative embodiment, a Zener diode Dz can advantageously be connected in series with the actuating coil 3. According to FIG. 2, the Zener diode Dz is preferably inserted in series with the actuating coil 3 and the means for measuring 24 the electric current I. Shunting means 21 connected in parallel with said diode are designed to shunt said Zener diode when the latter are in a closed position. In the first step of the diagnostic method as represented in FIG. 4B, the control means 20 send a drop-out order fixing a voltage called drop-out voltage at the terminals L1, L2 of the actuating coil 3. The "shunting" means 21 are in an open position and the drop-out voltage is fixed by the "Zener" diode Dz. The coil is then in "Zener" mode. The drop-out voltage fixed by the "Zener" diode Dz can be applied throughout the total drop-out time Ta or during a part of the drop-out time only. For example, as represented in FIG. 4B, the control means 20 place the actuating coil 3 in "Zener" mode during an intermediate drop-out time T1, and then place said coil in "free wheel" mode during a measuring period T2. Placing the coil in "Zener" mode during all or part of the drop-out time thus enables the opening time of the contactor to be reduced. Placing the coil in "Zener" mode during the whole of the drop-out time Ta achieves a maximum reduction of the opening time of the contactor.

According to an alternative embodiment that is not represented, the control means 20 place the actuating coil 3 in "free wheel" mode during an intermediate drop-out time, and then place said coil in "Zener" mode.

The second step of the diagnostic method according to this first embodiment consists in determining one or more specific values of the variation curve Si of the electric drop-out current I flowing in the actuating coil 3.

The specific value or values can for example be determined from:

One or more current values measured at a set time, or

Integration of current values measured over a set time range, or

One or more local extremum values, extremum being able to be a maximum or a minimum.

Figure 6:
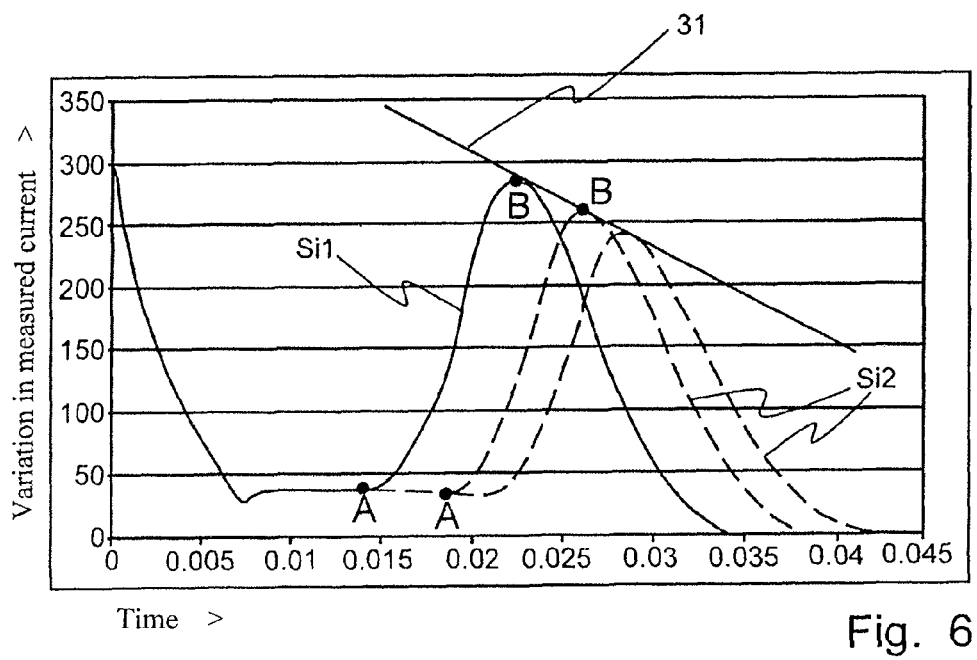
FIG. 6 represents curve plots of the variation of current measured during the method for diagnosing wear of a contactor in different operating states.

As observed in FIGS. 4A, 4B, several local extremum points A, B can be observed on the current variation curves Si. In particular, a first local maximum B fixes a maximum current Imax reached by the coil current in the movement phase of the movable part 5 of the actuator. This first local maximum B also enables the maximum time Timax separating the command sent by the control means 20 and the occurrence of said maximum current Imax to be defined. A first local minimum A corresponds substantially to the beginning of movement of the actuator core 5. As represented in FIG. 6, a first bold line curve Si1 a corresponds to the variation curve of a new actuator. Second broken line curves Si2 correspond to the variation curves of worn actuators.

Figure 7:
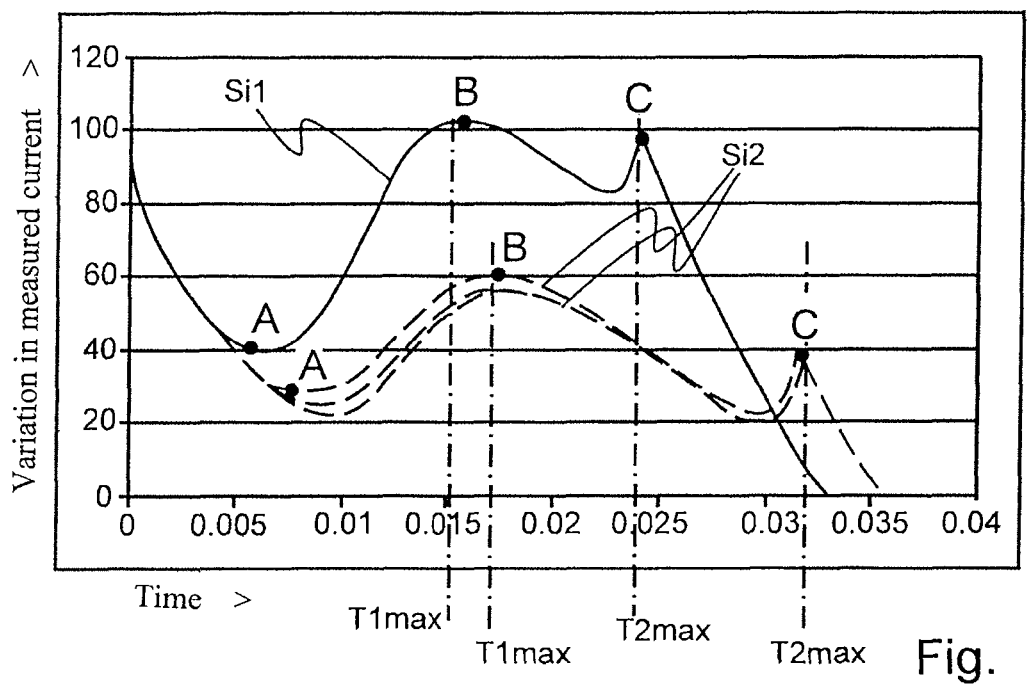
FIG. 7 represents curve plots of the variation of current measured during the method for diagnosing wear of a variant of a contactor in different operating states.
Figure 9:
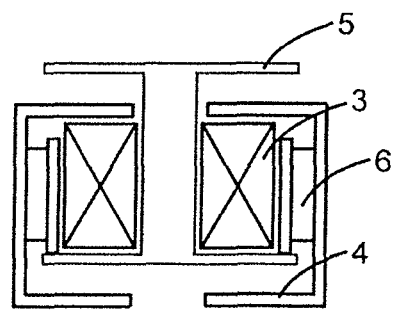
FIG. 9 represents a wiring diagram of a contactor actuator according to another embodiment of the invention.

In a particular embodiment of an actuator integrating at least one magnet, as represented in FIG. 9, a second local maximum C can be observed on the current variation curve Si (FIG. 7). The first and second local maxima B, C fix maximum currents Imax1, Imax2 reached by the coil current, in the movement phase of the movable part 5 of the actuator. Said local maxima B, C thus enable maximum times Timax1, Timax2 separating the command sent by the control means 20 and the occurrence of said maximum current Imax1 and Imax2 to be defined. These specific values are then representative of the speed of movement of the actuator. As represented in FIG. 7, a first bold line curve Si1 corresponds to the variation curve of a new contactor. Second broken line curves Si2 correspond to the variation curves of worn contactors.

In advantageous manner, the specific maximum current values observed can be compensated in temperature to prevent any measurement biasing linked to this external parameter, and enabling use of these specific values to be rendered more precise.

The third step of the diagnostic method according to this first embodiment consists in using the specific values and thereby enabling the state of operation to be determined.

Figure 5:
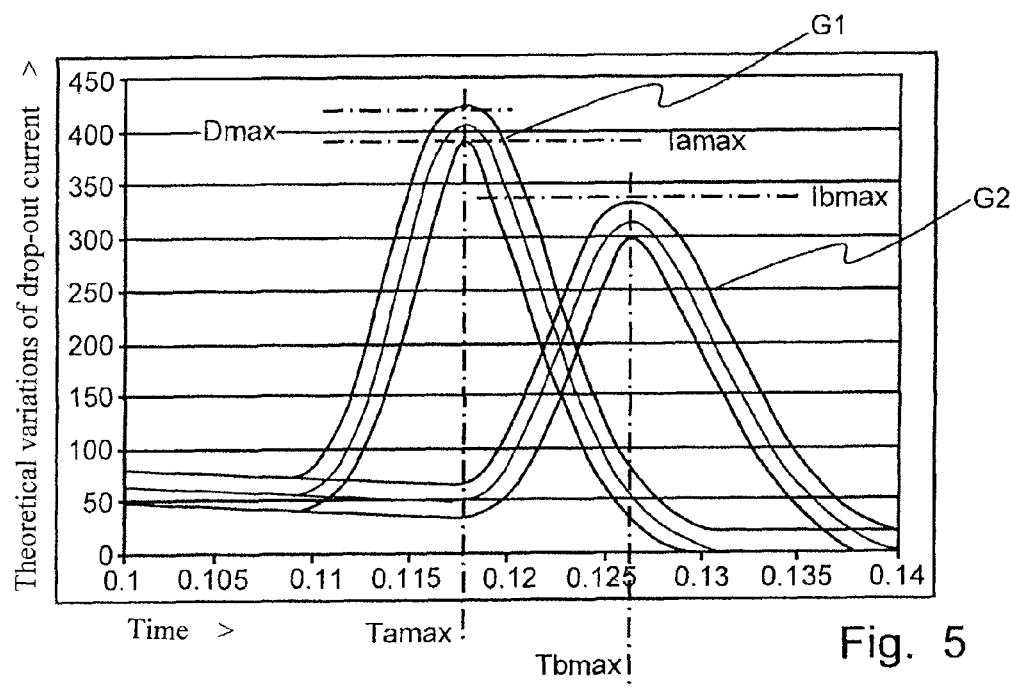
FIG. 5 represents reference values respectively corresponding to curves of the theoretical variation of a drop-out current for a new contactor and for a worn contactor.

Minimum and maximum reference values are preferably defined for each contactor, taking industrial dispersions into account. These reference values make it possible to determine, for each specific value, on the one hand a new state threshold using the limit of the new reference value originating from tolerancing, and on the other hand a worn state threshold using the limit of the worn reference value originating from tolerancing. As an example embodiment as represented in FIG. 5, a first reference value G1 representing a variation curve of the electric current during a drop-out phase of a new contactor enables the threshold values in new state Iamax and Tamax to be determined. A second reference value G2 representing a variation curve of the electric current during a drop-out phase of a worn contactor enables the threshold values in worn state Ibmax and Tbmax to be determined. Maximum dispersions are preferably defined for each specific value by means of the reference values of each contactor, taking its industrial dispersions into account. These reference values then enable a maximum dispersion corresponding to the natural variations of the different constituents of the contactor to be determined for each specific value. As an example embodiment as represented in FIG. 5, the reference value G1 representing the variation curve of the electric current during a drop-out phase of a new contactor enables the dispersion Dmax of the specific value Imax to be defined.

Furthermore, in order to render use of the specific values less sensitive to the parameters that are able to disturb measurement, a sliding average of the specific values recorded on a set number of previous consecutive operations can advantageously be made. Each specific value recorded and averaged on a set number of previous consecutive operations is thus then compared with the defined threshold values by means of the reference values. The position of the specific value relatively to the new and worn threshold values gives the information on the state of operation. Then, for each specific value recorded on a set number of previous consecutive operations, it is possible to calculate its sliding range, corresponding to the difference between the maximum value and the minimum value recorded on the previous operations. An abnormal operating state is diagnosed when the sliding range is greater than the maximum dispersion defined by the reference values, for each specific value.

Figure 2:
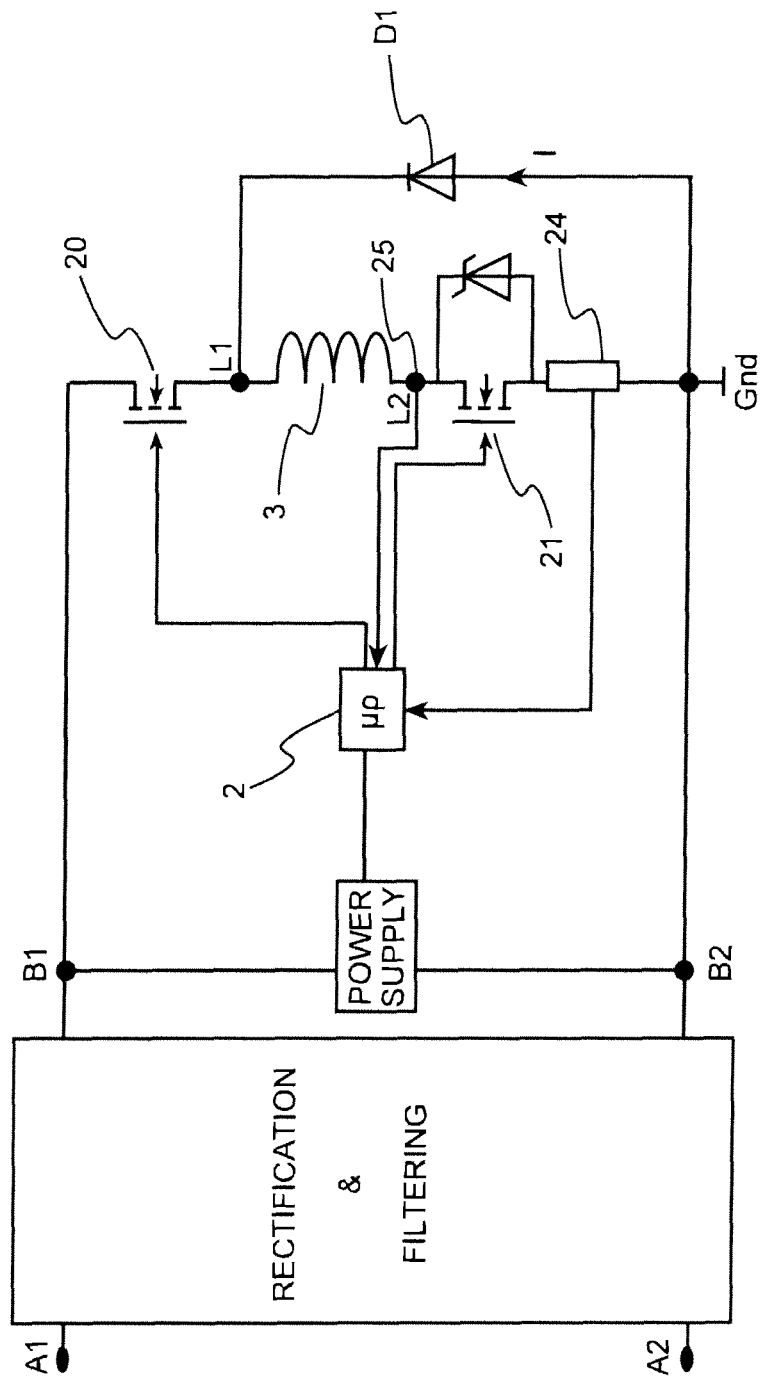
Figure 3:
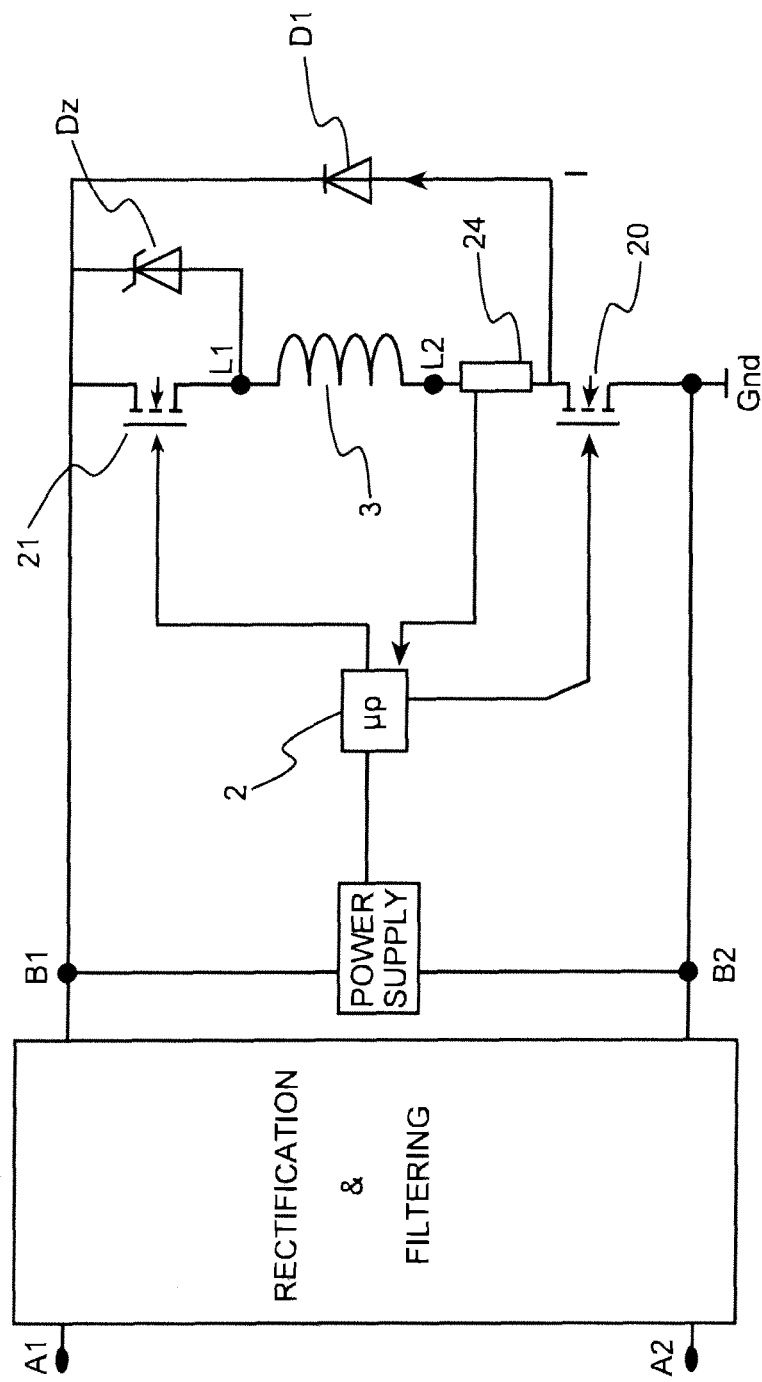

According to a second embodiment of the invention, the electric characteristic K measured in the course of the method being the voltage U at the terminals of the coil, the contactor then comprises means for measuring 25 the voltage of the actuating coil 3, during the opening phase of the contactor (FIG. 2).

A Zener diode Dz, of sufficiently high value so as not to limit variation of the voltage, is connected in series with the actuating coil 3, said Zener diode being able to be shunted by shunting means 21. The "shunting" means 21 are in an open position and the drop-out voltage is fixed by the "Zener" diode Dz. The coil is then in "Zener" mode. Finally, a free wheel diode D1 is connected in parallel to the assembly formed by said at least one actuating coil 3 and the Zener diode Dz, itself connected in parallel with the shunting means 21. In advantageous manner, as represented in FIG. 2, the means for measuring 25 the coil voltage can be achieved by measuring the potential on a first terminal of the coil L2, which potential can be transmitted to the processing unit 2 via a resistive divider bridge to be adjusted to the input voltage range of the processing unit 2. In the opening phase of the contactor and in the layout of this embodiment, the potential measured on a second terminal of the coil L1 corresponds to the ground B2 of the circuit, give or take a known diode voltage drop. The coil voltage thus corresponds to the potential on the second terminal of the coil L1, give or take a diode voltage drop, which greatly simplifies its acquisition.

In the first step of the diagnostic method of this second embodiment, the control means 20 send a drop-out order fixing a voltage called drop-out voltage at the terminals of the actuating coil 3. The "shunting" means 21 are in an open position and the drop-out voltage is fixed by the "Zener" diode Dz. The coil is then in "Zener" mode. The drop-out voltage fixed by the "Zener" diode Dz is applied throughout the drop-out time Ta. The electric voltage that is measured by the means for measuring 25 is representative of the speed of movement of the movable part 5 of the actuator. This second embodiment has the advantage of achieving a maximum reduction of the opening times of the contactor, while at the same time enabling a signal usable for diagnosing the operating state to be had.

The second step of the diagnostic method of this second embodiment consists in determining one or more specific values on the curve of the voltage variation at the terminals of the actuating coil 3. The specific value or values can for example be determined from:

One or more voltage values measured at a set time, or
Integration of the voltage values measured over a set time range, or
One or more local extremum values, extremum being able to be a maximum or a minimum.

The advantage of using the coil voltage, as opposed to using the coil current, is that this signal is independent from the temperature, which minimizes the measuring bias due to this external parameter.

Figure 10:
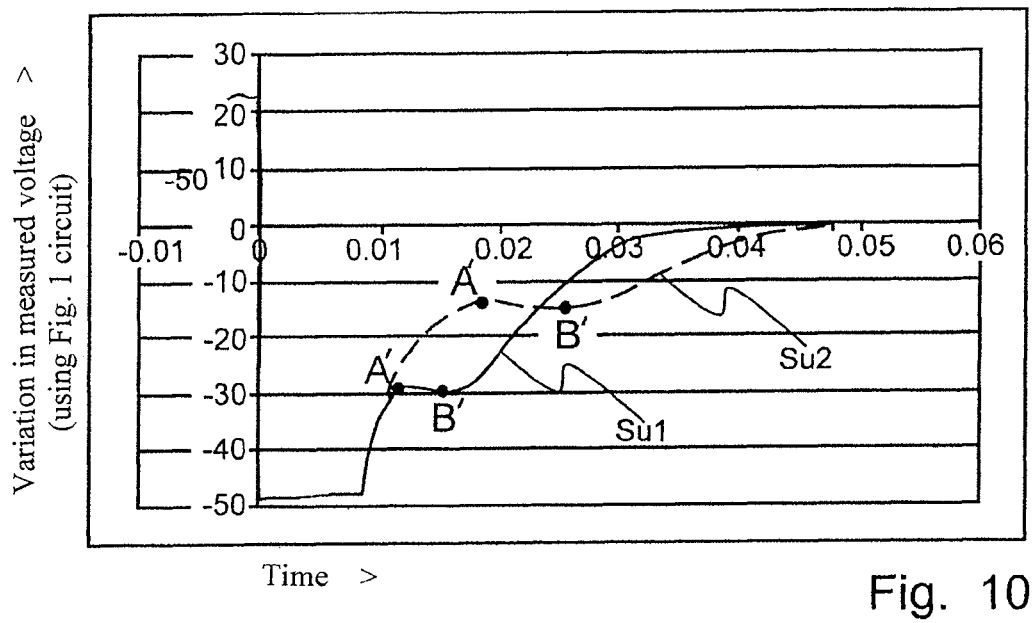
FIG. 10 represents curve plots of the variation of the voltage measured during the method for diagnosing wear according to a second embodiment of the invention using a control circuit according to FIG. 1.

According to a particular embodiment, the second step of the diagnostic method according to this first embodiment consists in determining one or more specific values on the variation curve Su of the electric drop-out voltage U at the terminals of the actuating coil 3. As observed in FIG. 10, several local extremum points A', B' can be observed on the voltage variation curves Su. In particular, a first local minimum B' enables the maximum time separating the command sent by the control means 20 and the occurrence of said local minimum B' to be defined. A first local maximum A' corresponds substantially to the beginning of movement of the actuator core 5. As represented in FIG. 10, a first bold line curve plot Su1 corresponds to the variation curve of a new actuator. Second broken line curve plots Su2 correspond to the variation curves of worn actuators.

Figure 11:
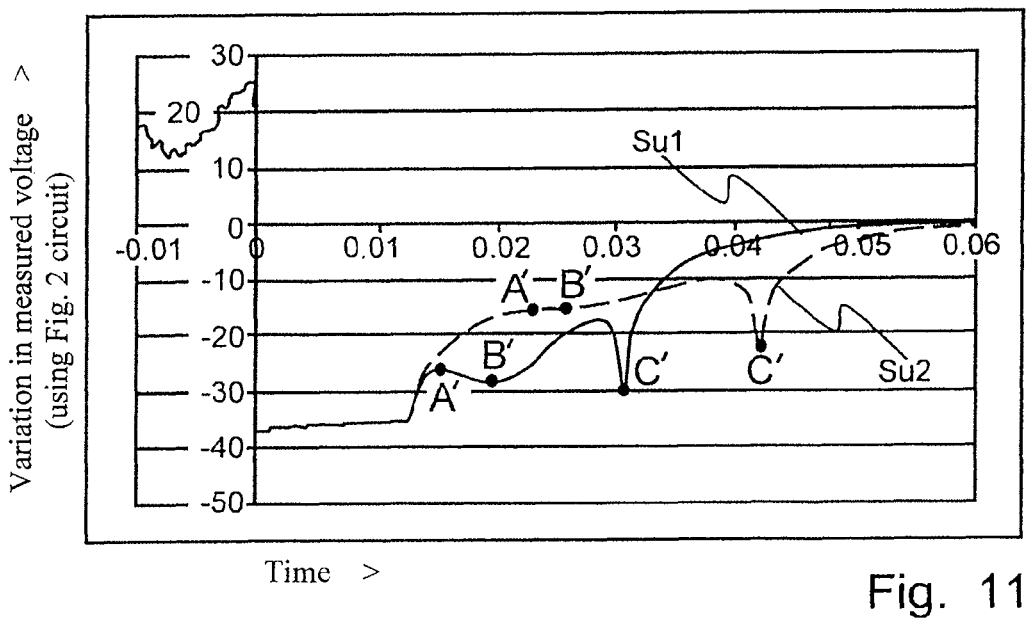
FIG. 11 represents curve plots of the variation of the voltage measured during the method for diagnosing wear according to a second embodiment of the invention using a control circuit according to FIG. 2.

In a particular embodiment of the contactor actuator integrating at least one magnet, as represented in FIG. 9, a second local minimum C' can be observed on the voltage variation curve Su (FIG. 11). The first and second local minima B', C' fix minimum voltages at the terminals of the coil, in the movement phase of the movable part 5 of the actuator. These specific values are then representative of the speed of movement of the actuator. As represented in FIG. 11, a first bold line curve plot Su1 corresponds to the variation curve of the voltage of a new contactor. Second broken line curve plots Su2 correspond to the variation curves of worn contactors.

The third step of the diagnostic method of this second embodiment consists in using the specific values and in thereby enabling the state of operation to be determined.

The invention claimed is:

1. A method for diagnosing an operating state of a contactor, which contactor comprises:
    a processing unit for directing a voltage control means;
    at least one actuating coil;
    means for measuring at least one electric characteristic of said at least one actuating coil; and
    at least one free wheel diode connected in parallel with said at least one actuating coil and the means for measuring;
the method comprising:
creating, for a specific design of contactor, a plurality of variation curves of a plurality of values of an electric characteristic of the actuating coils of a plurality of contactors of said design, over a drop-out period, by testing each of said plurality of contactors of said design by:
    sending a drop-out order thereby fixing a set drop-out voltage across the terminals of the actuating coil;
    after sending said drop-out order, repeatedly measuring the value of said electric characteristic of said actuating coil during a drop-out time period;
    said variation curves for each contactor comprising the plurality of measured values of said electric characteristic from said contactor;
then at a later time,
sending a diagnostic drop-out order thereby fixing the same set drop-out voltage across the terminals of the subject actuating coil of a contactor whose wear is being diagnosed;
    after sending said diagnostic drop-out order, measuring the same said electric characteristic of said subject actuating coil during a drop-out time period;
    identifying at least one measured specific value of the same measured electric characteristic of said subject actuating coil,
and comparing said at least one measured specific value with said plurality of variation curves of said same electric characteristic of said plurality of contactors of said same specific design,
thereby diagnosing a state of wear of said contactor.

2. The method for diagnosing according to claim 1, wherein said electric characteristic of said actuating coil measured during the drop-out time periods is the electric current flowing in the actuating coil.

3. The method for diagnosing according to claim 2, wherein said plurality of variation curves comprise specific values of measured electric current flowing in the actuating coils of said plurality of contactors of said specific design, said method additionally comprising:
    identifying, on the variation curve of the electric current for a contactor being diagnosed, the specific measured value at a first local maximum current, and
    diagnosing the state of operation of said contactor being diagnosed, by comparing said specific measured current value with the current values identified as the first local maximum current values on said plurality of variation curves.

4. The method for diagnosing according to claim 3, wherein said plurality of variation curves are after use variation curves for each of said plurality of contactors of said specific design after use thereof.

5. The method for diagnosing according to claim 4, wherein said plurality of variation curves additionally comprises a plurality of initial variation curves for the same said plurality of contactors of said specific design, when new.

6. The method for diagnosing according to claim 4, wherein diagnosing comprises comparing said specific measured current value with said maximum current values on said after use variation curves.

7. The method for diagnosing according to claim 2, wherein said plurality of variation curves comprise specific values of measured electric current flowing in the actuating coils of said plurality of contactors of said specific design,
said method additionally comprising:
identifying the elapsed drop-out time on each said variation curve of the electric current corresponding to a first local maximum current on said variation curve, and
diagnosing the state of operation of said contactor, by comparing the elapsed drop-out time at which said identified first local maximum current values occurred in the contactor being diagnosed, with the elapsed drop-out times at which the first local maximum current occurred in said plurality of variation curves.

8. The method for diagnosing according to claim 7, wherein said plurality of variation curves are after use variation curves for each of said plurality of contactors of said specific design after use thereof.

9. The method for diagnosing according to claim 8, wherein said plurality of variation curves additionally comprises a plurality of initial variation curves for the same said plurality of contactors of said specific design, when new.

10. The method for diagnosing according to claim 8, wherein diagnosing comprises comparing said elapsed drop-out time from the contactor being diagnosed with the elapsed drop-out time from the plurality of after use variation curves.

11. The method for diagnosing according to claim 1, wherein said electric characteristic of said actuating coil measured during the drop-out time periods is the electric voltage across the terminals of the actuating coil.

12. The method for diagnosing according to claim 11, wherein said plurality of variation curves comprise specific values of measured electric voltage across the terminals of the actuating coils of said plurality of contactors of said specific design,
said method additionally comprising:
identifying, for a contactor being diagnosed, the specific value on the variation curve of the electric voltage at a first local minimum voltage, and
diagnosing the state of operation of said contactor, by comparing said specific voltage value with the voltage values identified as the first local minimum voltage values on the plurality of variation curves.

13. The method for diagnosing according to claim 12, wherein said plurality of variation curves are after use variation curves for each of said plurality of contactors of said specific design after use thereof.

14. The method for diagnosing according to claim 13, wherein said plurality of variation curves additionally comprises a plurality of initial variation curves for the same said plurality of contactors of said specific design, when new.

15. The method for diagnosing according to claim 12, wherein diagnosing comprises comparing said specific measured voltage value with said minimum voltage values on said plurality of after use variation curves.

16. The method for diagnosing according to claim 11, wherein said plurality of variation curves comprise specific values of measured electric voltage across the terminals of the actuating coils of said plurality of contactors of said specific design,
said method additionally comprising:
identifying the elapsed drop-out time on each said variation curve of the electric current corresponding to a first local minimum voltage on said variation curve, and
diagnosing the state of operation of said contactor, by comparing the elapsed drop-out time at which said identified first local minimum voltage values occurred in the contactor being diagnosed, with the elapsed drop-out times at which the first local minimum voltage values occurred in said plurality of variation curves.

17. The method for diagnosing according to claim 16 wherein said plurality of variation curves are after use variation curves for each of said plurality of contactors of said specific design after use thereof.

18. The method for diagnosing according to claim 17, wherein said plurality of variation curves additionally comprises a plurality of initial variation curves for the same said plurality of contactors of said specific design, when new.

19. The method for diagnosing according to claim 16 wherein diagnosing comprises comparing said elapsed drop-out time from the contactor being diagnosed with the elapsed drop-out time from the plurality of after use variation curves.

20. The method for diagnosing according to claim 1, wherein the contactor comprises:
an electromagnetic actuator having a magnetic circuit comprising a magnetic yoke and a movable ferromagnetic core;
voltage control means for said actuator;
at least one actuating coil connected across first and a second supply terminals via said voltage control means;
a processing unit for acting on the voltage control means;
means for measuring an electric characteristic of said actuating coil, at least one free wheel diode being connected in parallel with said at least one actuating coil and the means for measuring;
said processing unit comprising:
means for identifying at least one specific value the measured electric characteristics;
comparison means for comparing said at least one specific value with a specific initial operating reference value of said contactor when new, thereby diagnosing a state of said contactor.

21. The method for diagnosis according to claim 20, wherein the contactor additionally comprises a Zener diode connected in series with the actuating coil.

22. The method for diagnosing according to claim 21, wherein the Zener diode is connected in series with the actuating coil and the means for measuring the electric current, and shunting means are connected in parallel with said diode for shunting said Zener diode when in a closed position.

23. The method for diagnosing according to claim 20, wherein the magnetic circuit of the actuator comprises a permanent magnet.

24. The method for diagnosing according to claim 1, wherein the drop-out voltage is fixed by the free wheel diode, the actuating coil being in free-wheel mode during a part of the drop-out time period.

25. The method for diagnosing according to claim 2, wherein the actuating coil is in free-wheel mode throughout the entire drop-out time period.

26. The method for diagnosing according to claim 1, wherein shunting means command a Zener diode to thereby fix the drop-out voltage across the terminals of the actuating coil, said coil being in Zener mode during a part of the drop-out time period.

27. The method for diagnosing according to claim 26, wherein the actuating coil is in Zener mode during an intermediate portion of the drop-out time period, the intermediate portion being shorter than the entire drop-out time period.

* * * * *